United States Patent
Nguyen et al.

(10) Patent No.: US 11,147,184 B2
(45) Date of Patent: Oct. 12, 2021

(54) POWER DISTRIBUTION WITH BATTERIES (71) Applicant: Hewlett Packard Enterprise Development LP, Houston, TX (US)

(72) Inventors: Hai Ngoc Nguyen, Spring, TX (US); Darrel G. Gaston, Spring, TX (US); Abhishek Banerjee, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 123 days.

(21) Appl. No.: 15/757,044

(22) PCT Filed: Sep. 11, 2015

(86) PCT No.: PCT/US2015/049717
§ 371 (c)(1),
(2) Date: Mar. 2, 2018

(87) PCT Pub. No.: WO2017/044122
PCT Pub. Date: Mar. 16, 2017

(65) Prior Publication Data
US 2018/0343767 A1 Nov. 29, 2018

(51) Int. Cl.
*H05K 7/14* (2006.01)
*G06F 1/26* (2006.01)
(Continued)

(52) U.S. Cl.
CPC ............ *H05K 7/1492* (2013.01); *G06F 1/26* (2013.01); *H02J 7/0013* (2013.01);
(Continued)

(58) Field of Classification Search
CPC .. H02J 9/062; H02J 7/0013; H02J 9/04; H02J 7/0063; H02J 7/02; H02J 9/02;
(Continued)

(56) References Cited

U.S. PATENT DOCUMENTS 5,859,499 A * 1/1999 McAfee ............... H02J 9/06
315/86
2003/0006709 A1 * 1/2003 Tabell ............... H05B 41/2853
315/129
(Continued)

FOREIGN PATENT DOCUMENTS

WO WO-2015047393 A2 4/2015

OTHER PUBLICATIONS

International Search Report and Written Opinion, International Application No. PCT/US2015/049717, dated Kim/ 7, 2016, pp. 1-9, KIPO.

(Continued)

*Primary Examiner* — Toan T Vu
*Assistant Examiner* — Elim Ortiz
(74) *Attorney, Agent, or Firm* — Hewlett Packard Enterprise Patent Department (57) ABSTRACT

According to some examples, solutions are provided for power distribution of input alternating current (AC) power to at least one power outlet while the input AC power is available, charging of a set of batteries by the input AC power while the input AC power is available, and power distribution of direct current (DC) power from the set of batteries to the power outlet when the input AC power is not available. For such examples, the power outlet is capable of conducting AC power and DC power to a load that is coupled to the power outlet and that can receive either AC power or DC power.

13 Claims, 5 Drawing Sheets (51) Int. Cl.
*H02J 7/02* (2016.01)
*H02J 9/06* (2006.01)
*H02J 7/00* (2006.01)
*H02J 9/04* (2006.01)

(52) U.S. Cl.
CPC .............. *H02J 7/0063* (2013.01); *H02J 7/02* (2013.01); *H02J 9/04* (2013.01); *H02J 9/062* (2013.01)

(58) Field of Classification Search
CPC ... H02J 9/061; H02J 7/00; H02J 9/068; Y10T 307/625; H05K 7/1492; H05K 7/1457; G06F 1/26; G06F 1/30; G06F 2200/261; G06F 1/305; G06F 1/28; H02M 1/10
See application file for complete search history.

(56) References Cited

U.S. PATENT DOCUMENTS

| | | |
|---|---|---|
| 2008/0030078 A1 | 2/2008 | Whitted et al. |
| 2008/0042492 A1* | 2/2008 | Gleason ................ H02J 9/062 307/66 |
| 2011/0006607 A1* | 1/2011 | Kwon ....................... G06F 1/30 307/66 |
| 2012/0307421 A1* | 12/2012 | Ewing .................. H01R 25/006 361/622 |
| 2013/0038242 A1* | 2/2013 | Athalye .............. H05B 45/3725 315/297 |
| 2013/0154365 A1 | 6/2013 | Sarti |
| 2013/0193764 A1 | 8/2013 | Bailey |
| 2013/0241287 A1 | 9/2013 | Hui |
| 2013/0254568 A1 | 9/2013 | Hou et al. |
| 2013/0278216 A1* | 10/2013 | Son ....................... H02J 7/0024 320/112 |
| 2014/0001862 A1 | 1/2014 | Hsueh |
| 2015/0188349 A1* | 7/2015 | Lee ........................... G06F 1/30 713/300 |
| 2016/0139185 A1* | 5/2016 | Watson ................ G01R 19/257 307/31 |

OTHER PUBLICATIONS

Mark Murrill, "Evaluating the Opportunity for DC Power in the Data Center" Oct. 20, 2010, 10 pps.

* cited by examiner

POWER DISTRIBUTION WITH BATTERIES

BACKGROUND

Power distribution units (PDUs) are commonly used devices in data centers. Generally, PDUs have a plurality of power outlets designed to distribute electric power to components of a data center, including rack-mount computers and network equipment. In addition to power distribution, a PDU can permit network-based control and monitoring of the PDU and its various functions.

BRIEF DESCRIPTION OF THE DRAWINGS

Certain examples are described in the following detailed description in sampled to the following drawings.

DETAILED DESCRIPTION

Traditionally, power distribution units (PDUs) and battery-backup units are separate systems. The battery-backup units usually provides power to PDUs in the event of a loss of primary power (to the PDUs), or is integrated into individual components (e.g., rack-mount servers) of the data center such that they support their individual components in the event of power loss. Drawbacks of maintaining separate PDUs and battery-backup units include that the two systems occupying more space in data centers or requiring special data center components capable of integrating battery-backup units within their chassis (e.g., integrated into the chassis of a rack-mount server). Additionally, maintaining separate PDUs and battery-backup units can unnecessarily result in loss of efficiency when direct current (DC) power provided by the battery-backup units eventually needs to be converted to alternating current (AC) power before the PDUs can provide it to individual data center components.

Various examples described herein provide for power distribution of input alternating current (AC) power to at least one power outlet while the input AC power is available, charging of a set of batteries based on the input AC power while the input AC power is available, and power distribution of direct current (DC) power from the set of batteries to the power outlet when the input AC power is not available. For such examples, the power outlet is capable of conducting AC power and DC power to a load coupled to the power outlet. Accordingly, when input AC power is unavailable, various examples permit direct current (DC) to be provided directly from the set of batteries to the load through the power outlet and, thereby obviating the need to convert the DC power from the set of batteries to the AC power before it provided to the load. Additionally, the physical footprint of separate power distribution and battery backup systems can be avoided where a solution described herein is implemented in a 0 rack unit (U) form factor.

According to some examples, while input AC power is available (e.g., being received) from a primary power source, the input AC power charges a set of batteries, and distributes the input AC power to a plurality of power outlets, each of which may be coupled to a load capable of receiving AC or DC power (e.g., a device having an AC/DC switch-mode power supply capable of operating off of AC power and DC power). The set of batteries may be in series-parallel configuration and may be capable of providing high-voltage DC power once charged (e.g., fully or partially charged) by the input AC power. When the input AC power is unavailable (e.g., ceases to be received), high-voltage DC power from the charged set of batteries can provide can be distributed to the same power outlets that were receiving the input AC power when the input AC power was available. As a result, when the input AC power is available (e.g., 277V or 240V), the load will be powered by distributed AC power from the input AC power, and when the input AC power is not available, the load will be powered by distributed high-voltage DC power from the set of batteries (e.g., 380V). Once the input AC power is available again (e.g., restored), distribution of the input AC power to the power outlets can resume.

While the set of batteries is providing the high-voltage DC power to a load through one of the power outlets, a battery management system associated with (e.g., included with) the set of batteries can monitor the load's power demand and adjust the output DC power being provided by the set of batteries accordingly. Depending on the example, adjusting the output DC power output from the set of batteries can comprise enabling or disabling subsets of batteries within the set of batteries.

The following provides a detailed description of the examples illustrated by FIGS. 1-5.

Figure 1:
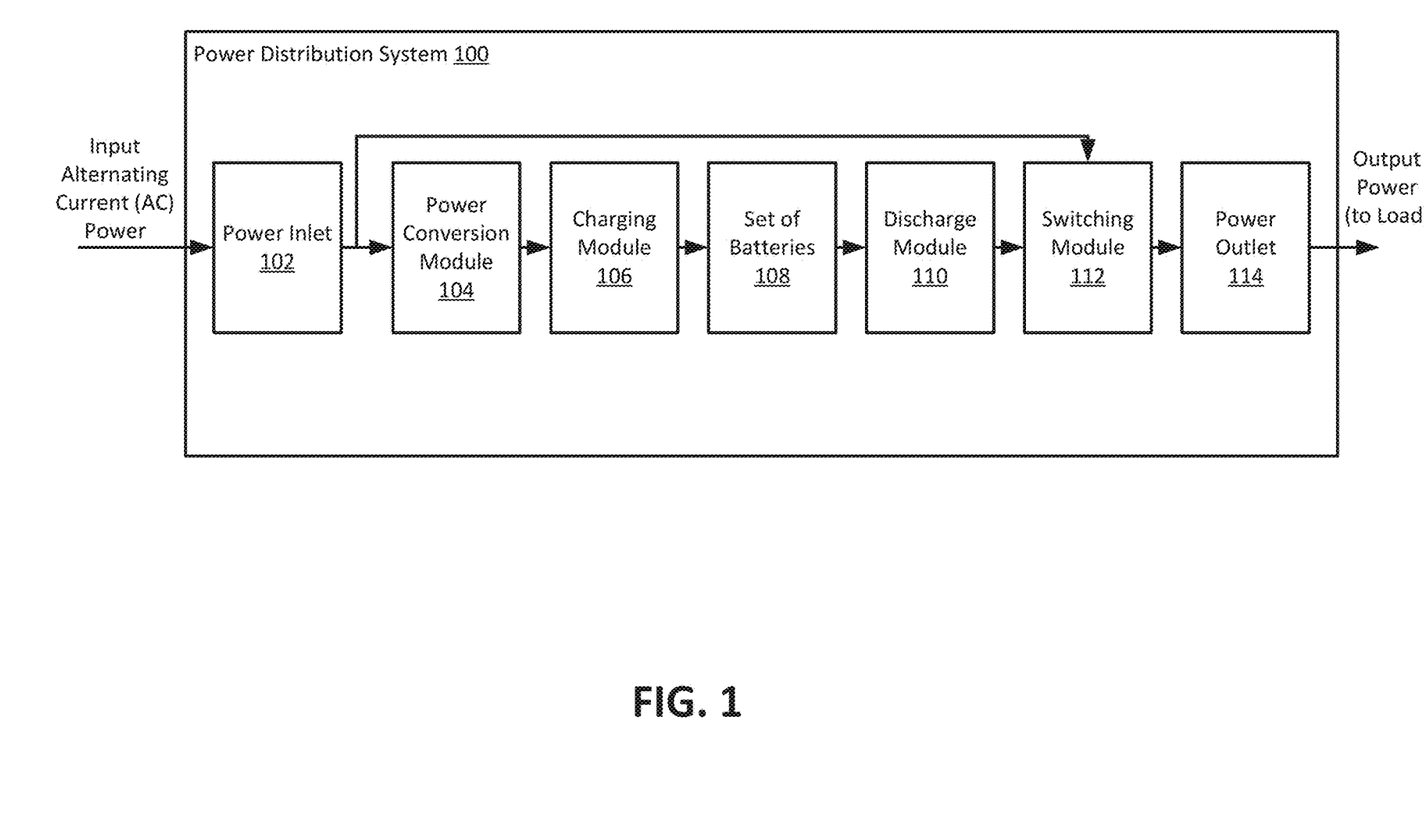
FIGS. 1 and 2 are block diagrams illustrating example power distribution systems according to the present disclosure.

FIG. 1 is a block diagram illustrating an example power distribution system 100 according to the present disclosure. According to some examples, the power distribution system 100 is implemented as part of a power distribution unit (PDU), which may be utilized in a data center to power various loads (e.g., data center components). For some examples, a PDU implementing the power distribution system 100 has a 0 rack unit (U) form factor, which permits for easier integration of the power distribution system 100 into a data center (e.g., installation with a set of racks commonly used to mount components within a data center). A load supported by the power distribution system 100 may be one capable of receiving alternating current (AC) power or direct current (DC) power. To facilitate receiving either AC power or DC power, the load may be configured with an AC/DC switch-mode power supply unit (PSU). As shown in FIG. 1, the power distribution system 100 comprises a power inlet 102, a power conversion module 104, a charging module 106, a set of batteries 108, a discharge module 110, a switching module 112, and a power outlet 114.

As used herein, modules and other components of various examples may comprise, in whole or in part, hardware (e.g., electronic circuitry), programming (e.g., machine-readable instructions), or a combination of both to implement functionalities described herein. For instance, a module may comprise computer-readable instructions executable by a processor to perform one or more functions in accordance with various examples described herein. In another instance, a module may comprise electronic circuitry to perform one or more functions in accordance with various examples described herein. In yet another instance, a module may comprise a combination of machine-readable instructions, stored on at least one non-transitory machine-readable storage medium, and at least one processing resource (e.g., controller) to execute those instructions.

The power inlet 102 may receive input alternating current (AC) power from a power source external to the power distribution system. For instance, the input AC power received by the power inlet 102 may be from a primary power source, such as a power grid maintained by a private or municipal utility company. For some examples, the power inlet 102 comprises an industry-compatible socket, such a male or female IEC three-wire connector (e.g., IEC-60320-C13 or IEC-60320-C19). With an industry-compatible socket, the power inlet 102 can couple to an industry-standard power outlet (e.g., NEMA 5-15 power outlet) capable of providing the input AC power to the power inlet 102 (e.g., using a power cable having a NEMA 5-15P connector at one end and IEC-60320-C13 connector at the other end). Additionally, depending on the example, the power inlet 102 may receive the input AC power from a 120V or a 240V power source.

The power conversion module 104 may convert the input alternative current (AC) power (120V or 240V AC), received by the power inlet 102, to direct current (DC) power (e.g., 240V DC). For the purpose of describing FIG. 1, we refer to the DC power outputted by the power conversion module 104 as input DC power. The power conversion module 104 may continue to provide the input DC power as long as the input AC power from the power inlet 102. The power conversion module 104 may comprise a rectifier to convert the input AC power to input DC power.

The charging module 106 may charge the set of batteries 108 by the input direct current (DC) power (e.g., 240V DC) provided by the power conversion module 104. The charging module 106 may continue to maintain the charge of the set of batteries 108 while the input DC power is being received from the power conversion module 104. Though FIG. 1 illustrates the power conversion module 104 and the charging module 106 as separate components, according to some examples, they are implemented as a single battery charging component (e.g., 300 W AC-DC charger).

The set of batteries 108 may comprise a set of batteries capable of being charged by the charging module 106, and providing direct current (DC) power to the discharge module 110. For some examples, the set of batteries comprises a set of lithium-ion batteries, which may be in a series-parallel configuration.

The discharge module 110 may provide direct current (DC) power from the set of batteries when the input AC power is not being received by the power inlet. For the purpose of describing FIG. 1, we refer to the DC power outputted by the discharge module 108 as output DC power. The discharge module 110 may provide the output DC power from the set of batteries by discharging a subset of the set of batteries (e.g., discharging three battery packs of the six battery packs available) to provide the output DC power. In particular, the discharge module 110 may select the subset based on the amount of the output DC power the discharge module 110 needs to provide a load through the power outlet 114. Additionally, the discharge module 110 may adjust the amount of the output DC power provided to the load by adjusting the subset of batteries being discharged (e.g., adjusting from three battery packs to two battery packs to reduce the output DC power). Depending on the example, the discharge module 110 may adjust the amount of the output DC power it provides the load based on the load (e.g., the power demand by the load).

The switching module 112 may provide (e.g., route) the input alternating current (AC) power from the power inlet 102 to the load through the power outlet 114 while the input AC power is being received by the power inlet 102. Additionally, the switching module 112 may provide (e.g., route) the output direct current (DC) power to the load through the power outlet 114 when the AC power is not being received by the power inlet 102. The switching module 112 may monitor the power inlet 102 (e.g., using AC detection circuitry, such as a power meter) to determine whether input AC power is available (e.g., being received) at the power inlet 102. For some examples, the switching module 112 includes a set of electronic switches (e.g., electronic relays) that permit the switching module to route AC power and DC power through the power distribution system 100.

The power outlet 114 may be one capable of conducting alternating current (AC) power or direct current (DC) power to a load to which it is coupled. The power outlet 114 may comprise comprises an industry-compatible socket, such as an IEC-60320-C13 or IEC-60320-C19 connector (male or female). With an industry-compatible socket, the power outlet 114 can couple to a power supply unit (PSU) capable of operating off of AC power and DC power provided by the power outlet 114. For some examples, the power outlet 114 comprises a plurality of power outlets, each capable of coupling to an individual load.

Figure 2:
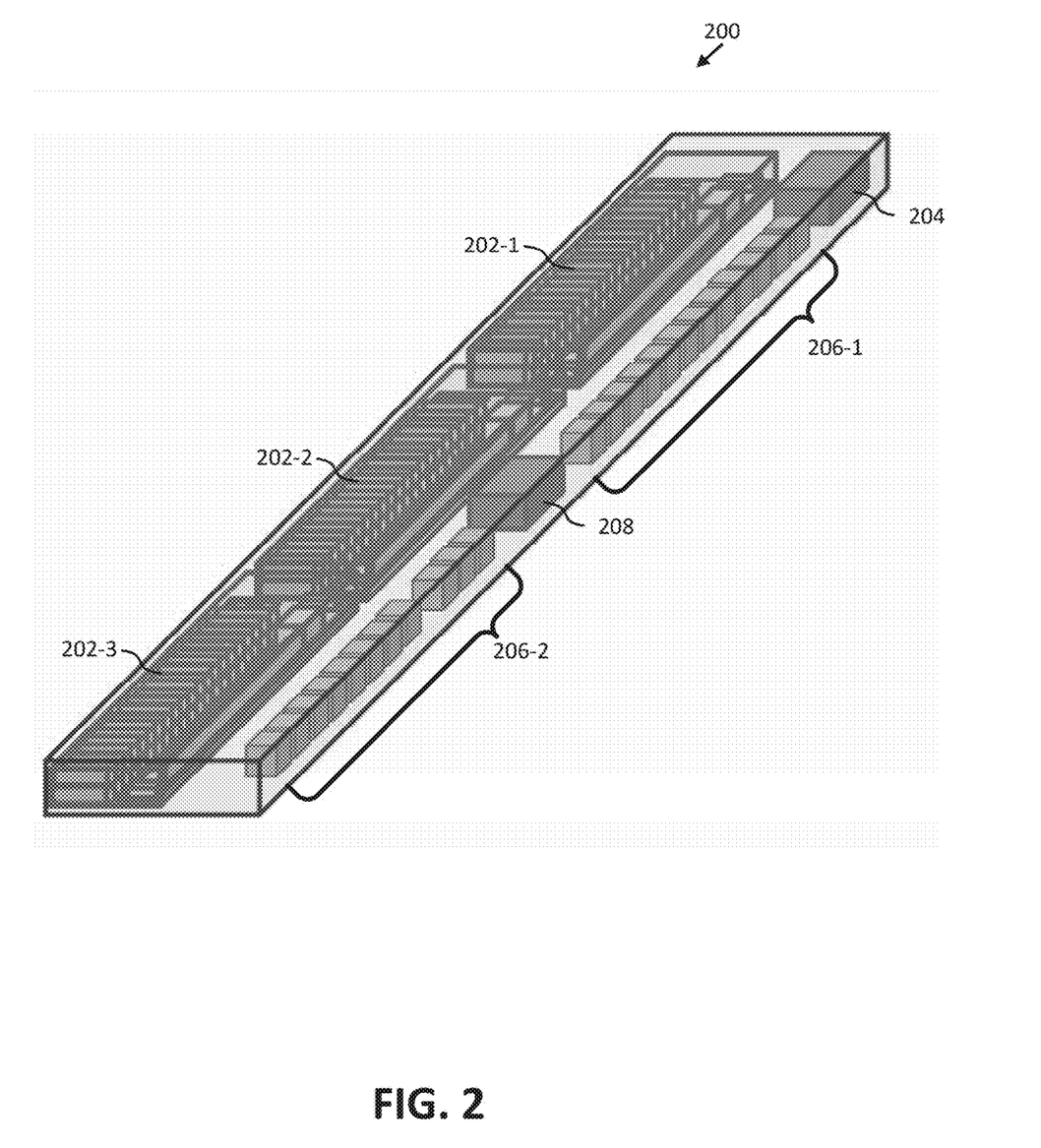

FIG. 2 is a block diagram illustrating an example power distribution system 200 implemented in a 0 rack unit (U) form factor according to the present disclosure. According to some examples, the power distribution system 200 as shown operates as a power distribution unit (PDU), which may be utilized in a data center to power various loads (e.g., data center components). Additionally, the power distribution system 200 may implement operations and functionalities similar to those of the power distribution system 100 described above with respect to FIG. 1. As illustrated, the power distribution system 200 includes three separate sets of batteries 202-1 through 202-3 (hereafter, collectively referred to as sets of batteries 202), an alternating current (AC) inlet 204, two separate pluralities of power outlets 206-1 and 206-2, and a control panel 208. For purposes of simplicity, other components of the power distribution system 200 have not been illustrated.

According to some examples, the AC inlet 204 provides input AC power for both the set of power outlets 206-1 and the set of power outlets 206-2. The sets of batteries 202 may be charged by way of the AC inlet 204. The pluralities of power outlets 206-1 and 206-2 can include at least one power outlet capable of conducting input AC power from the AC inlet 204, and direct current (DC) power from the some or all of the sets of batteries 202. Depending on the example, some or all of the sets of batteries 202 may be shared by pluralities of power outlets 206-1 and 206-2 to provide direct current (DC) power in the event that the input AC power is not available at the AC inlet 204. The control panel 208 may include a display (e.g., liquid crystal display [LCD]) and a user input control (e.g., a set of buttons) that permits a user (e.g., data center administrator) to monitor or control operation of the power distribution system 200 from outside the housing of the power distribution system 200.

Figure 3:
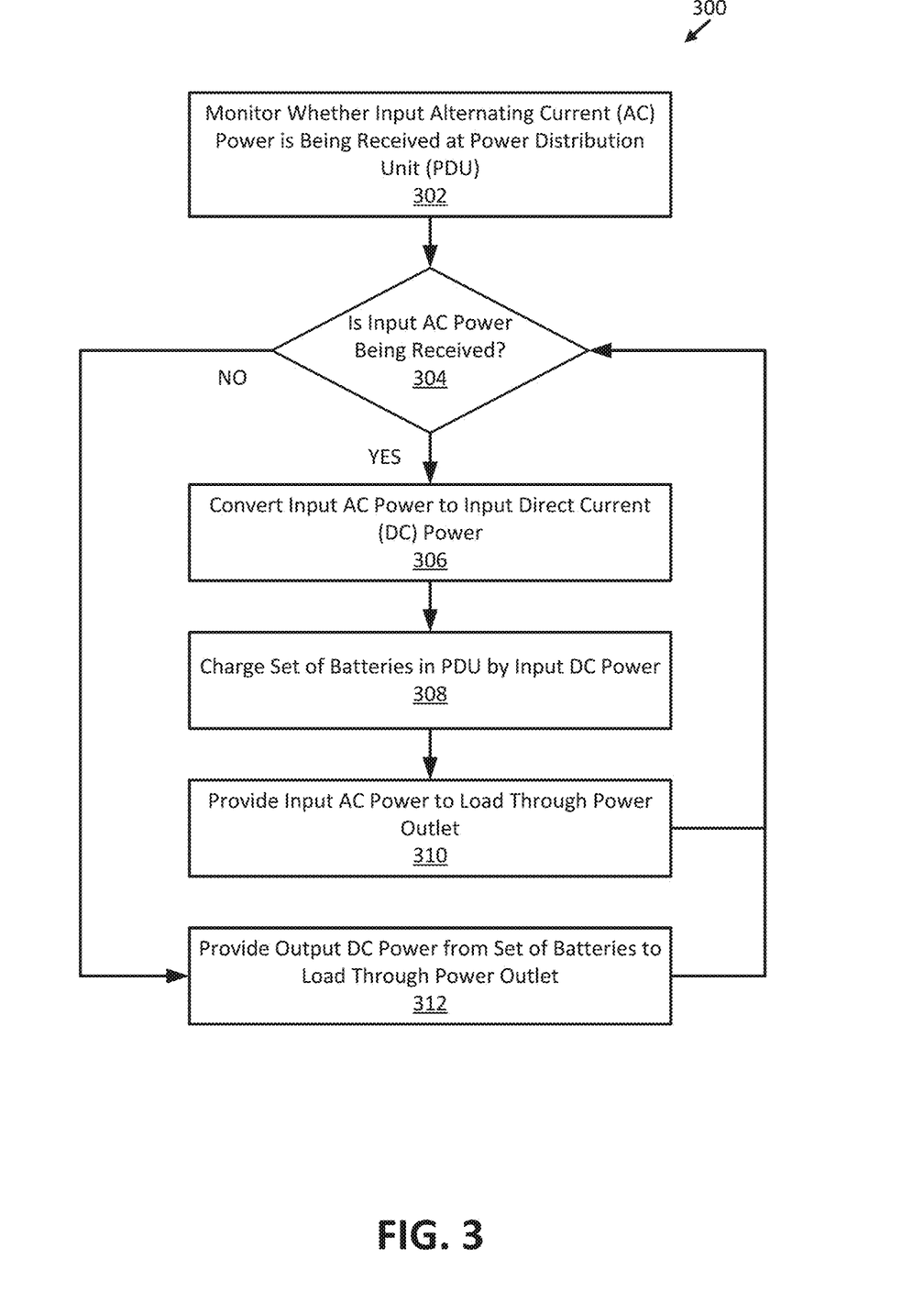
FIG. 3 is a flowchart illustrating an example method for power distribution according to the present disclosure.

FIG. 3 is a flowchart illustrating an example method 300 for power distribution according to the present disclosure. For some examples, the method 300 may be one performed with respect to a device that receives alternating current (AC) power and distributes AC power, such as power distribution unit (PDU). Though the method 300 is described below with respect to a PDU, other devices may be suitable for performing the method 300. Depending on the example, the method 300 may be implemented in the form of executable instructions stored on a machine-readable medium or in the form of electronic circuitry. For some examples, the operations performed or the order in which operations are performed may differ from what is illustrated by FIG. 3.

The method 300 may begin at block 302 by a power distribution unit (PDU) monitoring whether input alternating current (AC) power is being received at the PDU. In particular, the PDU may monitor whether the input AC power is being received by a power inlet of the PDU. As described herein, the input AC power may be received from a primary power source, such as power grid maintained by a private or municipal utility company. At block 304, if it is determined (by the monitoring at block 302) that the input AC power is being received at the PDU, the method 300 may continue to block 306. However, if at block 304 it is determined (by the monitoring at block 302) that the input AC power is not being received at the PDU, the method 300 may continue to block 312.

At block 306, the method 300 may continue by the power distribution unit (PDU) converting the input alternating current (AC) power, being received by the PDU (and monitored at block 302), to input direct current (DC) power. According to some examples, the conversion of the input AC power to the input DC power may be facilitated by a rectifier included by the PDU.

The method 300 may continue with block 308 by the power distribution unit (PDU) charging a set of batteries in the PDU by the input DC power produced at block 306. For some examples, the set of batteries comprises a set of lithium-ion batteries, which can provide high-voltage DC power once sufficiently charged. Depending on the example, the conversion of the alternating current (AC) power to the input direct current (DC) power and charging of the set of batteries is performed by a single (e.g., charging) unit (e.g., 300 W AC-DC charger).

The method 300 may continue with block 310 by the power distribution unit (PDU) providing (e.g., passing through) the input alternating current (AC) power, being received by the PDU (e.g., at a power inlet), to a load, and does so through a power outlet of the PDU. As described herein, the power outlet of the PDU may be one capable of conducted AC power and DC power to a load to which it is coupled. The method 300 may continue to loop through blocks 304, 306, 308, and 310 while the input AC power is being received by the PDU. At block 312, the method 300 may continue by the power distribution unit (PDU) providing output direct current (DC) power from the set of batteries, charged at block 308, to the load through same power outlet as the one used by the PDU at block 310. As described herein, the load may be one capable of receiving AC power and DC power. The method 300 may continue to loop through blocks 304 and 312 while the input alternating current (AC) power is not being received by the PDU. In response to the PDU resuming its reception of the input AC power (e.g., the primary power source being restored), the method 300 can transition back to looping through blocks 304, 306, 308, and 310.

Figure 4:
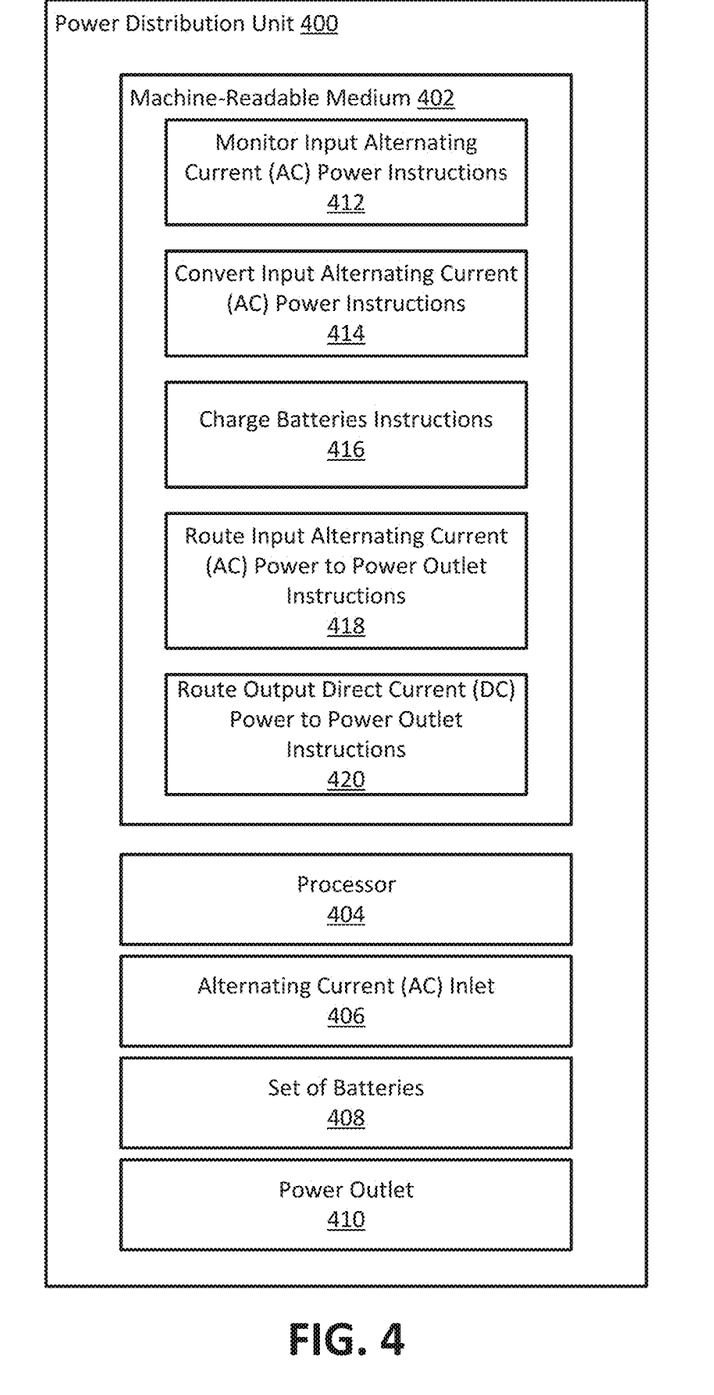
FIGS. 4 and 5 are block diagrams illustrating example power distribution units (PDUs) according to the present disclosure.

FIG. 4 is a block diagram illustrating an example power distribution unit (PDU) 400 according to the present disclosure. In FIG. 4, the power distribution unit 400 as illustrated includes a machine-readable medium 402, a processor 404, an alternating current (AC) inlet 406, a set of batteries 408, and a power outlet 410. According to some examples, the PDU 400 implements operations and functionalities similar to those of the power distribution system 100 described above with respect to FIG. 1. In various examples, the components or the arrangement of components of the PDU 400 may differ from what is depicted in FIG. 4. For instance, the PDU 400 can include more or less components than those depicted in FIG. 4.

The machine-readable medium 402 may be any electronic, magnetic, optical, or other physical storage device that stores executable instructions. For example, the machine-readable medium 402 may be a Random Access Memory (RAM), an Electrically-Erasable Programmable Read-Only Memory (EEPROM), a storage drive, an optical disc, or the like. The machine-readable medium 402 can be encoded to store executable instructions that cause the processor 404 to perform operations in accordance with various examples described herein. In various examples, the machine-readable medium 402 is non-transitory. As shown in FIG. 4, the machine-readable medium 402 includes a monitor input alternating current (AC) power instructions 412, convert input AC power instructions 414, charge batteries instructions 416, route input AC power to power outlet instructions 418, and route output direct current (DC) to power outlet instructions 420.

The processor 404 may be a set of central processing units (CPUs), microprocessors, controllers (e.g., microcontrollers), or other hardware devices suitable for retrieval and execution of one or more instructions stored in the machine-readable medium 402. The processor 404 may fetch, decode, and execute the instructions 412, 414, 416, 418, and 420 to enable the power distribution unit (PDU) 400 to perform operations in accordance with various examples described herein. For some examples, the processor 404 includes one or more electronic circuits comprising a number of electronic components for performing the functionality of one or more of the instructions 412, 414, 416, 418, and 420.

The alternating current (AC) inlet 406 may receive input alternating current (AC) power from a power source external to the power distribution unit (PDU) 400, such as a power grid (e.g., local to the data center). The AC inlet 406 may, for example, comprise an industry-compatible socket, such a male or female IEC three-wire connector (e.g., IEC-60320-C13), which can couple to an industry-standard power outlet (e.g., NEMA 5-15 power outlet) using a power cable. The input AC power received by the AC inlet 406 can range from 120V to 240V.

The set of batteries 408 may comprise a set of batteries capable of being charged based on input alternating current (AC) power received by the AC inlet 406 while the input AC power is available, and capable of providing direct current (DC) power to a load through the power outlet 410 when the input AC power is not available. As described herein, the set of batteries 408 may comprise lithium-ion batteries capable of outputting high-voltage DC power.

The power outlet 410 may be one capable of conducting alternating current (AC) power or direct current (DC) power to a load to which it is coupled. Depending on the example, the power outlet 410 may comprise an industry-compatible socket, such as an IEC-60320-C13 or IEC-60320-C19 connector (male or female), which can couple to a power supply having capable of operating off of AC power and DC power provided by the power outlet 410.

The monitor input alternating current (AC) power instructions 412, may cause the processor 404 to monitor whether input alternating current (AC) power is being received at the AC inlet 406 of the power distribution unit (PDU) 400 (e.g., at the AC inlet 406). Such monitoring may be facilitated by AC detection circuitry (e.g., a power meter), which may be included by the AC inlet 406.

The convert input alternating current (AC) power instructions 414 may instruct the processor 404 to cause the input AC power to be converted to input direct current (DC) power while the input AC power is being received at the power distribution unit (PDU) 400 (e.g., as determined by the monitor input AC power instructions 412). The processor 404 may cause this conversion using a rectifier included by the PDU 400.

The charge batteries instructions 416 may instruct the processor 404 to cause the set of batteries 408 in the power distribution unit (PDU) 400 to charge by the input alternating current (AC) power received at the AC inlet 406. Additionally, the route input AC power to power outlet instructions 418 may instruct the processor 404 to do the foregoing while the input AC power is being received at the power distribution unit (PDU) 400 (e.g., as determined by the monitor input AC power instructions 412). The processor 404 may cause the set of batteries 408 to charge by way of a battery charger included by the PDU 400. For some examples, the rectifier used to convert the input AC power to direct current (DC) power and the battery charger used to charge the set of batteries 408 may be a single component, such as an AC-DC charger. Accordingly, for some such examples, instructions 414 and 416 may be combined to instruct the processor 404 to route the input AC power to the single component (e.g., AC-DC charger).

The route input AC power to power outlet instructions 418 may instruct the processor 404 to cause the input AC power to be routed to a load that is coupled to the power outlet 410 and that is capable of receiving alternating current (AC) power and direct current (DC) power. Additionally, the route input AC power to power outlet instructions 418 may instruct the processor 404 to do the foregoing while the input AC power is being received at the power distribution unit (PDU) 400 (e.g., as determined by the monitor input AC power instructions 412).

The route output direct current (DC) to power outlet instructions 420 may instruct the processor 404 to cause output DC power from the set of batteries 408 to the load, which (as noted above) is coupled to the power outlet 410 and is capable of receiving alternating current (AC) power and DC power. Further, the route output direct current (DC) to power outlet instructions 420 may instruct the processor 404 to do the foregoing while the input AC power is not being received at the power distribution unit (PDU) 400 (e.g., as determined by the monitor input AC power instructions 412).

The processor 404 may facilitate routing power in the power distribution unit (PDU) 400 using a set of electronic switches (e.g., electronic relays) included by the PDU 400. Such electronic switches can be controlled by the processor 404 to create an electrical path from a power source (e.g., the AC inlet 406 or the set of batteries 408) to a power drain (e.g., the power outlet 410).

Figure 5:
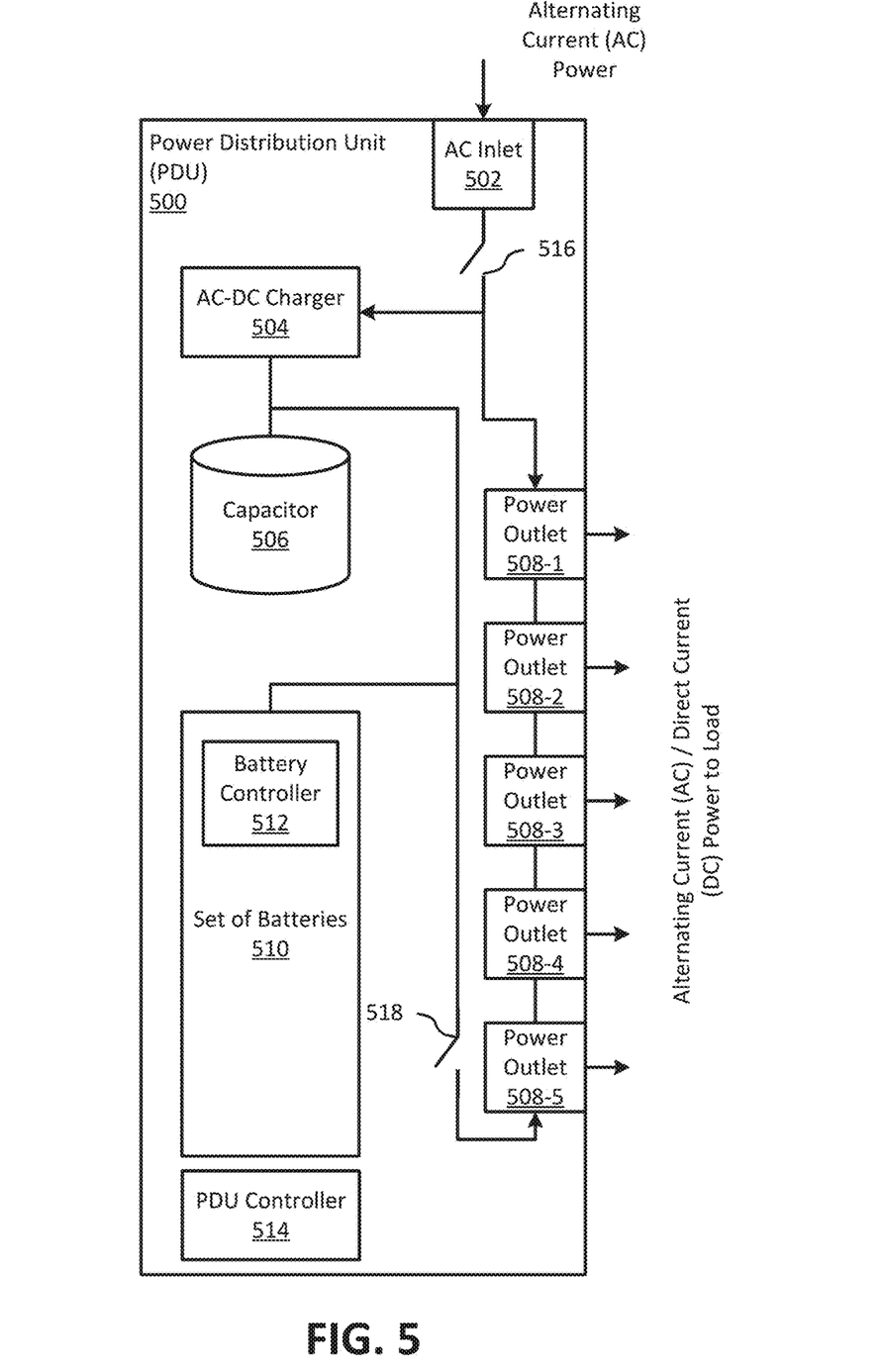

FIG. 5 is a block diagram illustrating an example power distribution unit (PDU) 500 according to the present disclosure. The power distribution unit 500 as shown includes an alternating current (AC) inlet 502, an AC-DC charger 504, a capacitor 506, power outlets 508-1 to 508-5 (collectively referred to as power outlets 508), a set of batteries 510 including a battery controller 512, a PDU controller 514, and electronic switches 516 and 518. As also shown, the AC inlet 502 is coupled to the electronic switch 516; the electronic switch 516 is coupled to the AC-DC charger 504 and the power outlets 508; the AC-DC charger 504 is coupled to the capacitor 506, the set of batteries 510, and the electronic switch 518; and the electronic switch 518 is coupled to the power outlets 508. According to some examples, the PDU 500 may be an implementation of the PDU 400 described above with respect to FIG. 4.

During operation, the alternating current (AC) inlet 502 receive input AC power from a primary power source, such as a power grid (e.g., local to the data center). While it detects that the input AC power is being received (e.g., available), the power distribution unit (PDU) controller 514 may cause the electronic switch 516 to be closed (e.g., enabled) and the electronic switch 518 to be open (e.g., disabled). Such a configuration can cause the input AC power to be routed from the AC inlet 502 to the AC-DC charger 504, and to be routed from the AC inlet 502 to the power outlets 508, which causes the input AC power to be passed-through to individual loads coupled to individual outlets of the power outlets 508. Based on the input AC power it receives form the AC inlet 502, the AC-DC charger 504 can produce direct current (DC) power to charge the capacitor 506 and charge the set of batteries.

While it detects that the input alternating current (AC) power is not being received (e.g., unavailable), the power distribution unit (PDU) controller 514 may cause the electronic switch 516 to be opened (e.g., disabled) and the electronic switch 518 to be closed (e.g., enabled). Such a configuration can cause output direct current (DC) power to be routed from the set of batteries 510 (and the capacitor 506) to the power outlets 508, thereby causing the output DC to pass to individual loads coupled to individual outlets of the power outlets 508. As described herein, the individual loads can be ones that can receive and be power off of AC power and DC power. The battery controller 512 can cause the set of batteries 510 to regulate the amount of output DC power it provides to the power outlets 508, and may do so based on power demand of the individual loads coupled to the power outlets 508. According to some examples, regulating the amount of output DC power the set of batteries 510 provide involves selecting and discharging a subset of the set of batteries 510 to produce the output DC power.

Once charged, the capacitor 506 can stabilize the output DC power provided by the set of batteries 510 when the power distribution unit (PDU) controller 514 causes the PDU 500 to transition from routing the input AC power to the power outlets 508 to routing the output DC power to the power outlets 508.

In the foregoing description, numerous details are set forth to provide an understanding of the subject disclosed herein. However, various examples may be practiced without some or all of these details. Some examples may include modifications and variations from the details discussed above. It is intended that the appended claims cover such modifications and variations.

The invention claimed is:

1. A power distribution system, comprising: a power inlet to receive input alternating current (AC) power; a power outlet to selectively conduct AC power and direct current (DC) power to a load capable of receiving AC power and DC power; a set of batteries; a power conversion module to convert the input AC power to input DC power; a charging module to charge the set of batteries by the input DC power while the input AC power is being received by the power inlet; a discharge module to provide output DC power from the set of batteries when the input AC power is not being received by the power inlet; and a switching module having a first switch and a second switch, the first switch being enabled and the second switch being disabled to provide the input AC power to the load through the power outlet when the input AC power is being received by the power inlet, and the first switch being disabled and the second switch being enabled to provide the output DC power to the load through the power outlet when the AC power is not being received by the power inlet; and a housing including the power inlet, the power outlet, the set of batteries, the charging module, the discharge module, the power conversion module, and the switching module, wherein the housing has a 0 rack unit (U) form factor.

2. The power distribution system of claim 1, wherein the load is an AC/DC switch-mode power supply unit (PSU).

3. The power distribution system of claim 1, wherein the set of batteries are arranged in series-parallel configuration.

4. The power distribution system of claim 1, wherein the discharge module is to provide the output DC power from the set of batteries by discharging a subset of batteries in the set of batteries to provide the output DC power.

5. The power distribution system of claim 1, wherein the discharge module is to adjust an amount of the output DC power provided to the load through the power outlet, the adjusted amount being based on the load.

6. The power distribution system of claim 5, wherein the discharge module is to provide the output DC power from the set of batteries by discharging a subset of batteries in the set of batteries, and wherein the discharge module is to adjust the amount of the output DC power provided to the load by adjusting the subset of batteries.

7. A method, comprising: monitoring whether input alternating current (AC) power is being received at a power distribution unit (PDU); while the input AC power is being received at the PDU, converting the input AC power to input direct current (DC) power, charging a set of batteries in the PDU by the input DC power, and providing the input AC power to a load capable of receiving AC power and DC power, wherein the input AC power is provided through a power outlet of the PDU; and when the PDU is not receiving the input AC power, providing output DC power from the set of batteries to the load by disabling a first switch in a switching module of the PDU and enabling a second switch in the switching module, wherein the output DC power is provided through the power outlet of the PDU; wherein the PDU, the set of batteries, the switching module, and the power outlet are included in a housing which has a 0 rack unit (U) form factor.

8. The method of claim 7, wherein the set of batteries are arranged in series-parallel configuration.

9. The method of claim 7, wherein providing the output DC power from the set of batteries to the load comprises discharging a subset of batteries in the set of batteries to provide the output DC power.

10. The method of claim 7, wherein providing the output DC power from the set of batteries to the load comprises adjusting an amount of the output DC power provided to the load through the power outlet, the adjusted amount being based on the load.

11. The method of claim 10, wherein providing the output DC power from the set of batteries to the load comprises discharging a subset of batteries in the set of batteries, and adjusting the amount of the output DC power provided to the load through the power outlet comprises adjusting the subset of batteries.

12. A non-transitory machine-readable medium having instructions stored thereon, the instructions being executable by a processor of a power distribution unit (PDU), the instructions causing the processor to:

monitor whether input alternating current (AC) power is being received at the PDU;

while the input AC power is being received at the PDU, cause the input AC power to be converted to input direct current (DC) power, cause a set of batteries in the PDU to charge by the input DC power, and cause the input AC power to be routed to a load capable of receiving AC power and DC power, wherein the input AC power is routed to the load through a power outlet of the PDU, by enabling a first switch in a switching module of the PDU and disabling a second switch in the switching module; and in response to the PDU transitioning from receiving the input AC power to not receiving the input AC power, cause output DC power to be routed from the set of batteries to the load, by disabling the first switch and enabling the second switch, wherein the output DC power is routed to the load through the power outlet of the PDU;

wherein the PDU, the set of batteries, the switching module, and the power outlet are included in a housing which has a 0 rack unit (U) form factor.

13. The non-transitory machine-readable medium of claim 12, wherein the load is an AC/DC switch-mode power supply unit (PSU).

* * * * *